March 22, 1966 L. D. ARMSTRONG 3,242,061

METHOD OF MAKING A TUNNEL DIODE ASSEMBLY

Filed March 7, 1962

INVENTOR
LORNE D. ARMSTRONG

BY Hubbell and Cohen

ATTORNEYS.

United States Patent Office 3,242,061
Patented Mar. 22, 1966

3,242,061
METHOD OF MAKING A TUNNEL DIODE ASSEMBLY

Lorne D. Armstrong, Somerville, N.J., assignor, by mesne assignments, to The Micro State Electronics Corporation, Murray Hill, N.J., a corporation of New Jersey Filed Mar. 7, 1962, Ser. No. 178,139
7 Claims. (Cl. 204—143)

Figure 1:
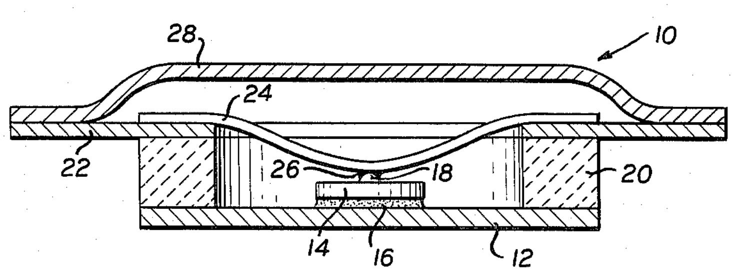

This invention relates to tunnel diodes and particularly to tunnel diodes using a gallium antimonide crystal. More particularly the present invention relates to a method of manufacturing a tunnel diode employing a gallium antimonide crystal.

While germanium tunnel diodes have gained wide acceptance in the art, recent studies indicate that tunnel diodes made of gallium antimonide show a much lower noise constant (K) than germanium tunnel diodes and show similar or better other characteristics such as, for instance, lower capacitance for particular peak current, high peak to valley current ratio etc. As the noise constant K of the tunnel diode is the fundamental limiting factor of the noise figure of microwave tunnel diode amplifiers, gallium antimonide tunnel diodes become extremely attractive for certain applications, particularly in microwave amplifiers.

It is therefore one object of the present invention to provide a new and improved tunnel diode employing a gallium antimonide crystal.

Still a further object of the present invention is the provision of a new and improved method of manufacturing a tunnel diode including a gallium antimonide crystal.

The above and other objects, characteristics and features of the present invention will be more fully understood from the following description taken in connection with the accompanying illustrative drawing.

Figure 2:
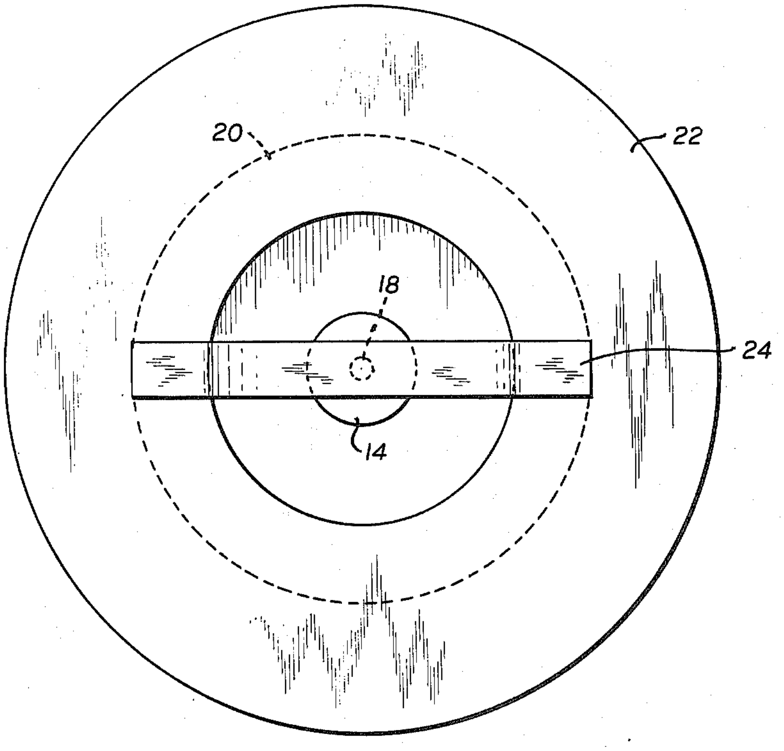

In the drawing:

FIG. 1 is a vertical sectional view of a tunnel diode employing a gallium antimonide crystal; and FIG. 2 is a top plan view of the tunnel diode shown in FIG. 1 with the cover removed.

Referring now to the drawing in detail, the tunnel diode or tunnel diode assembly is generally designated by the reference character 10. The diode assembly 10 includes a metal disc or header 12 to which is soldered a gallium antimonide crystal wafer 14 by means of indium solder 16. Alloyed to the upper surface of the wafer 14 is a small dot of tin-tellurium alloy. The dot 18 may be made of an alloy falling within the following range: tin 95 to 99.9% and tellurium 5 to 0.1%. The preferred composition for the dot 18 is 98% tin and 2% tellurium. Other combinations of metals using tellurium or other n-type dopant may be employed. For example, in addition to tin, satisfactory results may be obtained with any metal which can be alloyed to gallium antimonide such as, for example, and not by way of limitation, gold, silver, lead, and cadmium. In addition to the tellurium dopant, any n-type dopant may be employed. For example, tin and selenium would be eminently satisfactory. Irrespective of the metal or dopant employed the ranges of metal and dopant should be 95 to 99.9% and 5 to 0.1% dopant, with 98% metal and 2% dopant being the preferred composition.

Overlying the periphery of the header 12 is a hollow cylinder of insulating material 20 which may be of any suitable compositions such as, for instance, alumina or the like. The method of connection of the hollow cylindrical ring 20 to the header 12 may be by any suitable means such as, for instance, the use of solder or adhesives. It is presently preferred to employ a high temperature solder such as the silver-copper eutectic solder sold by Handy and Harman under the designation B.T. for securing the ring 20 to the header 12. Such a solder will withstand comparatively high temperatures and can effect a hermetic seal between the two elements.

Connected to the upper surface of the ring 20 is a hollow disc or washer 22 of suitable conducting material such as, for instance, metal. The manner of connecting the washer 22 to the top of the ring 20 may be any suitable method such as, for instance, the use of a solder. Connected to the washer 22 in conducting relation therewith is a connector strip 24 which is made preferably of nickel or platinum although other conducting materials may be employed. The manner of connecting the connector strip 24 to the washer 22 may be any suitable method that will place the two elements in electrically conducting relationship, such as, for instance, welding or soldering. The connector strip 24 is also connected to the tin-tellurium dot 18 in electrical conducting relation therewith. This connection may be effected by means of an indium solder 26 although solder may be dispensed with and the dot may be bonded directly to connector strip as by heating them to about 250° C., preferably in a reducing atmosphere. Overlying the top of the washer 22 is a cover plate 28 which is secured to the washer as by welding or soldering or the like in order to effect a hermetic seal between the washer 22 and the cover plate. In this manner the entire assembly 10 is hermetically sealed.

In accordance with the method of manufacturing the above described tunnel diode assembly 10, a gallium antimonide crystal doped with a p-type material such as zinc, cadmium, manganese, etc., to a doping level from $3\times10^{18}/cm.^3$ to $1\times10^{20}/cm.^3$ is sliced preferably perpendicular to the 111 plane, although other planes may be used, and then lapped and etched in an acid solution. The preferred doping material is zinc. The acid should be a mixture of nitric and hydrofluoric acid and may contain a suitable moderator such as water or acetic acid.

As between the nitric acid and hydrofluoric acid, the proportions shall fall within 50 to 95% nitric acid and 50 and 5% hydrofluoric acid. However, this mixture can be moderated in order to retard the etching of the nitric-hydrofluoric acid mixture by the addition of a moderator up to approximately 35% of the resulting solution. A highly satisfactory acid etch would consist of 95 parts of nitric acid, 5 parts of hydrofluoric acid and 50 parts of glacial acetic acid. In setting forth the ranges of the various acids above it should be borne in mind that commercial nitric acid is generally sold at 70% concentration as is glacial acetic acid whereas the hydrofluoric acid is generally available at 50% concentration and that the ranges given above are in terms of such concentrations.

The sliced gallium antimonide crystal is lapped and etched by the acid until the thickness thereof is somewhere between .002 inch and .012 inch with a thickness of approximately .006 inch preferred. The slice is then diced into squares of convenient size, for instance, 0.25 x .025 inch. The dot 18 is then placed on the upper surface of the crystal 14. As stated hereinbefore the metallic dot 18 is made preferably of an alloy of tin and tellurium which alloy ranges in composition from 95 to 99.9% tin and 5 to 0.1% tellurium, with a composition of 98% tin and 2% tellurium being preferred, although other n-type alloys may be employed. The dot 18 when placed on the upper surface is in the form of a small sphere of the order of .003 inch in diameter. The alloying may be accomplished in two ways. In the first alloying technique, the alloying is done at elevated temperatures of about 450° C. to 500° C. with the thermal cycling thereof being critical. Specifically, after the alloy sphere is placed on the upper surface of the crystal 14, they are rapidly heated to a temperature of between about 450° C. and 500° C., the temperature increase being effected preferably in less than 10 seconds. Thereafter the temperature is maintained for approximately 1 to 3 minutes, depending on the results desired, and after the heat soak the temperature is rapidly dropped to 100° C. or less, the cooling rate being not less than about 50° C./second. Preferably, the heat treatment described herein is accomplished in the presence of a flux, such as, for instance, hydrazine or activated rosin flux such as the flux sold by the Alpha Metals Company and designated as their 346–343 type. The presence of the flux expedites the alloying of the tin-tellurium dot 18 to the gallium antimonide crystal 14.

The second alloying technique, which is presently preferred, is performed at lower temperatures and utilizes a much slower cooling rate. Specifically, after the alloy dot 18 is placed on the surface of the gallium antimonide crystal wafer 14, the assembly is heated to a temperature of about 350° C. preferably in the presence of a suitable flux. The rate of heating is preferably very rapid to assist the flux action, the order of heating time being not more than about ten seconds. Once the dot 14 is up to temperature it does not have to be soaked at such temperature although, preferably, it is soaked or held at said 350° C. temperature for between about 30 seconds and two minutes. Subsequently, the temperature is slowly dropped at a rate not in excess of about 10° C. per second until the temperature is down to at most 100° C.

The higher temperature cycle temperature described above yields more consistent results because of better alloy-wetting control. The alloying when such technique is employed is much deeper into the gallium antimonide crystal but connecting problems to the alloy dot 14 are more difficult. The low temperature cycle described above yields better final electric characteristics, primarily due to the reduced alloy penetration, which optimizes the geometry in the final etched device.

After the dot 18 has been alloyed to the wafer 14, the lower surface of the wafer 14 is mounted on the header 12 as by soldering, the soldering being effected preferably by the use of an indium solder in the presence of zinc chloride flux, although other low melting solders may be used. The temperature at which the soldering is effectuated is preferably between 150° C. and 250° C. with about 200° C. being preferred. Overheating crystal 14 during the soldering operation can permanently destroy the electrical characteristics of the crystal 14 whereas underheating may result in poor electrical and mechanical connections between the crystal and the header.

The soldering of the crystal-dot subassembly to the base 12 may be accomplished after the base or header has already had secured thereto the insulating ring 20 as by the use of solder and the ring 20 may already have connected thereto a metallic washer 22 which, as noted hereinbefore, may be secured to the ring 20 by the use of solder.

After mounting the crystal 14 on the header assembly 12–20–22, the connector strip 24 here shown to be a longitudinally extending strip of metal, preferably platinum or nickel, which is bowed in the center in order to bring it into proximity with the upper surface of the dot 18, is connected to the dot preferably by means of an indium or other low melting solder and further preferably in the presence of an activated flux such as that sold commercially by Alpha Metals under the designation BIA, although solder may be dispensed with. Again, the soldering should be accomplished at a temperature between about 150° C. and 250° C. with a temperature of about 200° C. being preferred. In the alternative, the connector strip may be bonded directly to the dot 18 by holding them in surface-to-surface contact and heating them to about 250° C., preferably in a reducing atmosphere. After connection is effected between the strip and the dot, either by soldering or by direct bonding, the connector strip is welded or soldered to the washer 22 in order to effect electrical connection to the washer.

The final characteristics of the tunnel diode are established by means of an electrical etching process in a potassium hydroxide or sodium hydroxide solution. The solution is preferably of a strength of between about 10 to 40 percent concentration with a 20% concentration of potassium hydroxide or sodium hydroxide being preferred. The etching bath in order to be effective must be at an elevated temperature between 50° C. and 75° C. with a temperature of approximately 60° C. being preferred. The anode of the power supply for the electrical etching bath is connected to the dot side only of the tunnel diode as, for instance, to the connector strip 24. The cathode may be a nickel or Nichrome strip which is connected to the cathode of the power supply. The power supply must be adjusted so that the etching current is extremely low, of the order of 1 milliampere or less. Naturally the amount of etching is dependent solely on the desired current range of the tunnel diode and will vary in accordance with such desires.

After etching to the desired current range the unit is removed from the caustic bath and is washed in deionized water, rinsed in a suitable solvent such as acetone, and then dried. Thereafter, the cover 28 is connected to the ring 22 in sealing relation therewith, the relation being effected in a dry air ambient to insure minimum moisture content within the sealed chamber containing the crystal 14.

While I have herein shown and described a preferred tunnel diode assembly embodying the present invention and a preferred method of manufacturing same, and have suggested various modifications therein, other changes and modifications may be made therein within the scope of the appended claims without departing from the spirit and scope of this invention.

What I claim is:

1. The method of manufacturing a tunnel diode assembly including a wafer of gallium antimonide, comprising the steps of forming said wafer by taking a crystal of gallium antimonide doped with p-type material, said doped crystal having a level of between about $3\times10^{18}$/cm.$^3$ and $1\times10^{20}$/cm.$^3$, slicing said crystal perpendicular to its 111 axis, and then lapping said crystal and etching said lapped and sliced crystal in an acid bath including nitric acid and hydrofluoric acid to a thickness between about .002 inch and .012 inch, alloying a metal dot consisting essentially of about 95% to 99.5% tin and about 5% to 0.5% tellurium to a surface of said wafer by placing said dot on said wafer surface, raising the temperature of said dot and wafer to about 350° C., and then reducing said temperature to not more than about 100° C. at a rate of not more than 10° C. per second.

2. The method of manufacturing a tunnel diode assembly including a wafer of gallium antimonide, comprising the steps of forming said wafer by slicing a crystal of zinc doped p-type gallium antimonide having a level of between about $3\times10^{18}$/cm.$^3$ and $1\times10^{20}$/cm.$^3$ perpendicular to its 111 axis, and then lapping said crystal and etching said lapped and sliced crystal in an acid bath including nitric acid and hydrofluoric acid to a thickness between about .002 inch and .012 inch, alloying a metal dot consisting essentially of about 95% to 99.5% tin and about 5% to 0.5% tellurium to a surface of said wafer by placing said dot on said wafer surface, raising the temperature of said dot and wafer to about 350° C., and then reducing the temperature to not more than about 100° C. at a rate of not more than 10° C. per second, and soldering a metallic plate to the other surface of said wafer with indium solder at a temperature between about 150° C. and 250° C., and soldering a conductor to said metal dot with indium solder at a temperature between about 150° C. and 250° C.

3. The method of manufacturing a tunnel diode assembly including a wafer of gallium antimonide, comprising the steps of forming said wafer by slicing a crystal of zinc doped p-type gallium antimonide having a level of between about $3\times10^{18}/cm.^3$ and $1\times10^{20}/cm.^3$ perpendicular to its 111 axis, and then lapping said crystal and etching said lapped and sliced crystal in an acid bath including nitric acid and hydrofluoric acid to a thickness between .002 inch and .012 inch, alloying a metal dot consisting essentially of about 95% to 99.5% tin and about 5% to 0.5% tellurium to a surface of said wafer by placing said dot on said wafer surface, raising the temperature of said dot and wafer to about 350° C., and then reducing said temperature to not more than about 100° C. at a rate of not more than 10° C. per second, and then electrically etching said tunnel diode assembly by operatively electrically connecting said dot to the anode of a power supply, operatively electrically connecting the cathode of said power supply to a nickel bearing electrode, immersing said tunnel diode assembly and said electrode in a bath of the class consisting of potassium hydroxide and sodium hydroxide at a strength between about 10% and 40% said bath heated to a temperature of between about 50° C. and 75° C. and then passing a current between said electrode and said assembly of not more than about 1 milliampere.

4. The method of manufacturing a tunnel diode assembly including a wafer of gallium antimonide, comprising the steps of forming said wafer by slicing a crystal of zinc doped p-type gallium antimonide having a level of between about $3\times10^{18}/cm.^3$ and $1\times10^{20}/cm.^3$ perpendicular to its 111 axis, and then lapping said crystal and etching said lapped and sliced crystal in an acid bath including nitric acid and hydrofluoric acid to a thickness between about .002 inch and .012 inch, alloying a metal dot consisting essentially of about 95% to 99.5% tin and about 5% to 0.5% tellurium to a surface of said wafer by placing said dot on said wafer surface, raising the temperature of said dot to about 350° C., and then reducing said temperature to not more than about 100° C. at a rate of not more than 10° C. per second, and soldering a metallic plate to the other surface of said water with indium solder at a temperature between about 150° C. and 250° C., and soldering a conductor to said metal dot with indium solder at a temperature between about 150° C. and 250° C.; and then electrically etching said tunnel diode assembly by operatively electrically connecting said dot to the anode of a power supply, operatively electrically connecting the cathode of said power supply to a nickel bearing electrode, immersing said tunnel diode assembly and said electrode in a bath of the class consisting of potassium hydroxide and sodium hydroxide at a strength between about 10% and 40%, said bath being heated to a temperature of between 50° C. and 75° C., and then passing a current between said electrode and said assembly of not more than about 1 milliampere.

5. The method of manufacturing a tunnel diode assembly including a wafer of gallium antimonide, comprising the steps of forming said wafer by slicing a crystal of zinc doped p-type gallium antimonide having a level of between about $3\times10^{18}/cm.^3$ and $1\times10^{20}/cm.^3$ perpendicular to its 111 axis, and then lapping said crystal and etching said lapped and sliced crystal in an acid bath including nitric acid and hydrofluoric acid to a thickness between about .002 inch and .012 inch, alloying a metal dot consisting essentially of about 95% to 99.5% tin and about 5% to 0.5% tellurium to a surface of said wafer by placing said dot on said wafer surface, raising the temperature of said dot and wafer to about 350° C., and then reducing said temperature to not more than about 100° C. at a rate of not more than 10° C. per second, and then electrically etching said tunnel diode assembly by operatively electrically connecting said dot to the anode of a power supply, operatively electrically connecting the cathode of said power to an electrode of the class consisting of nickel and Nichrome, immersing said tunnel diode assembly in a bath of the class consisting of potassium hydroxide and sodium hydroxide at a strength of about 20%, said bath being heated to a temperature of about 60° C., and then passing a current between said electrode and said assembly of not more than about 1 milliampere.

6. The method of manufacturing a tunnel diode assembly including a wafer of gallium antimonide, comprising the steps of forming said wafer by slicing a crystal of zinc doped p-type gallium antimonide having a level of between about $3\times10^{18}/cm.^3$ and $1\times10^{20}/cm.^3$ perpendicular to its 111 axis, and then lapping said crystal and etching said lapped and sliced crystal in an acid bath consisting essentialy of about 95 parts nitric acid of 100% concentration, 5 parts hydrofluoric acid of 50% concentration and about 50 parts glacial acetic acid of 100% concentration to a thickness of about .006 inch alloying a metal dot consisting essentially of about 98% tin and about 2% tellurium to a surface of said wafer by placing said dot on said wafer surface, raising the temperature of said dot and wafer to about 350° C., and then reducing the temperature to not more than about 100° C. at a rate of not more than 10° C. per second, soldering a metallic plate to the other surface of said wafer indium solder at a temperature of about 250° C. in the presence of zinc chloride flux, soldering at about 200° C. a connector strip formed of a metal of the class consisting of platinum and nickel to said dot with indium solder in the presence of an activated flux, and then electrically etching said tunnel diode assembly by operatively electrically connecting said dot to the anode of a power supply, operatively electrically connecting the cathode of said power to an electrode of the class consisting of nickel and Nichrome, immersing said tunnel diode assembly in a bath of the class consisting of potassium hydroxide and sodium hydroxide at a strength of about 20%, said bath being heated to a temperature of about 60° C., and then passing a current between said electrode and said assembly of not more than about 1 milliampere.

7. The method of manufacturing a tunnel diode assembly including a wafer of gallium antimonide, comprising the steps of forming said wafer by slicing a crystal of zinc doped p-type gallium antimonide having a level of between about $3\times10^{18}/cm.^3$ and $1\times10^{20}/cm.^3$ perpendicular to its 111 axis, and then lapping said crystal and etching said lapped and sliced crystal in an acid bath including nitric acid and hydrofluoric acid to a thickness between about .002 inch and .012 inch, alloying a metal dot consisting essentially of about 95% to 99.5% tin and about 5% to 0.5% tellurium to a surface of said wafer by placing said dot on said wafer surface, raising the temperature of said dot and wafer to about 350° C., and then reducing the temperature to not more than about 100° C. at a rate of not more than 10° C. per second, and soldering a metallic plate to the other surface of said wafer with indium solder at a temperature between about 150° C. and 250° C., and bonding a conductor to said metal dot in electrically conducting relation therewith by heating said dot to about 250° C. while in engagement with said conductor, said heating of said dot being done while said conductor and dot are in a reducing atmosphere.

References Cited by the Examiner

UNITED STATES PATENTS

| | | | |
|---|---|---|---|
| 2,807,561 | 9/1957 | Nelson | 148—1.5 |
| 2,932,594 | 4/1960 | Mueller | 148—1.5 |
| 2,956,216 | 10/1960 | Jenny et al. | 148—1.5 X |
| 3,027,501 | 3/1962 | Pearson | 148—1.5 X |
| 3,033,714 | 5/1962 | Ezaki et al. | 148—33 |

OTHER REFERENCES

Gunn: "Semiconductor Device Fabrication," I.B.M. Technical Disclosure Bulletin, vol. 4, No. 7, December 1961, p. 53.

JOHN H. MACK, *Primary Examiner.*

RAY K. WINDHAM, *Examiner.*